United States Patent
Ko

(10) Patent No.: US 8,262,962 B2
(45) Date of Patent: Sep. 11, 2012

(54) DIE-CUT AND METHOD OF MANUFACTURING OR ASSEMBLING DIE-CUTS FROM THE COMPONENTS THEREOF

(76) Inventor: Kwangwoo Michael Ko, White Bear Lake, MN (US)

( * ) Notice: Subject to any disclaimer, the term of this patent is extended or adjusted under 35 U.S.C. 154(b) by 687 days.

(21) Appl. No.: 11/973,279

(22) Filed: Oct. 5, 2007

(65) Prior Publication Data

US 2008/0268195 A1    Oct. 30, 2008

Related U.S. Application Data

(60) Provisional application No. 60/926,298, filed on Apr. 26, 2007.

(51) Int. Cl.
*B32B 37/00* (2006.01)
(52) U.S. Cl. .............. 264/139; 156/60; 156/63
(58) Field of Classification Search .................. 264/139; 156/60, 63
See application file for complete search history.

(56) References Cited

U.S. PATENT DOCUMENTS

| 3,850,167 | A | * | 11/1974 | Seeley ............................ 602/6 |
| 4,944,822 | A | * | 7/1990 | Ishikawa et al. .............. 156/212 |
| 5,782,152 | A | | 7/1998 | Reis et al. |
| 5,800,661 | A | | 9/1998 | Reis et al. |
| 5,870,937 | A | | 2/1999 | Reis et al. |
| 6,364,990 | B1 | | 4/2002 | Grosskopf et al. |
| 7,093,642 | B2 | | 8/2006 | Sharp et al. |

* cited by examiner

*Primary Examiner* — Yogendra Gupta
*Assistant Examiner* — John Robitaille
(74) *Attorney, Agent, or Firm* — James W. Miller

(57) ABSTRACT

Methods are provided for assembling desired die-cuts from individual die-cut components. Each individual die-cut component may consist of films of various materials, diverse adhesive tapes, diverse foam materials, fabrics, metals and others. Individual die-cut components are assembled onto liners that function as carriers or platforms. The liners may be in individual panels or continuous rolls. Individual die-cut components are assembled onto the liner using computer controlled pick and place equipment with a high degree of accuracy and speed. The liner may consist of a film with controlled adhesive strength to maintain the x-y position of placed individual die-cut components. The die-cut comprising the liner and assembled die-cut components is then used for various purposes, such as holding two parts together, in the assembly of various products, such as cell phones.

17 Claims, 2 Drawing Sheets

DIE-CUT AND METHOD OF MANUFACTURING OR ASSEMBLING DIE-CUTS FROM THE COMPONENTS THEREOF

CROSS REFERENCE TO RELATED APPLICATIONS

This application claims the benefit of one or more previously filed provisional applications identified as follows: Application Ser. No. 60/926,298 filed Apr. 26, 2007.

TECHNICAL FIELD

This invention relates to die-cuts used in the manufacture of electronic and other products, such as cell phones, to join or hold two parts of the product together and for other purposes. More particularly, this invention relates to a method of manufacturing or assembling die-cuts and to the improved die-cuts so manufactured or assembled.

BACKGROUND OF THE INVENTION

Die-cuts of various materials are used to provide mechanical assembly of two (2) parts as in adhesive tapes, sealing of parts as in gaskets with or without adhesives, and other functions. In these instances, the die-cuts are typically placed between two (2) parts to achieve specific purposes, e.g. the assembly or sealing of the parts. Die-cuts of appropriate materials are also used for functions such as masking as in tapes with adhesive on one side of a film, shielding from RFI/EMI (radio frequency interference/electro magnetic interference), and for other purposes. Adhesive tapes with adhesive only on one (1) side of a film are typically used for masking applications.

Die-cuts are manufactured by cutting chosen materials into desired geometric designs. This is accomplished by diverse techniques depending on the material. Typically, for organic materials such as films, adhesive tapes, pads, foams and others, mechanical stamping dies are used. Computer controlled cutting tools such as knife and laser and other methods are employed to manufacture die-cuts as well.

For typical mechanical assembly purposes, adhesive die-cuts are used to bond two mechanical parts together, such as portions of a cell phone. Adhesive die-cuts are typically pressure sensitive adhesives provided in the form of tapes. Pressure sensitive adhesive tape consists of only the adhesive material and is typically available in rolls. Double coated tape consists of adhesive coated on both top and bottom sides of a film. The film may be made of polyester and other organic and inorganic materials.

The pressure sensitive adhesive products described above are typically carried on and/or covered by liners for ease of handling, processing and storage. Typically these liners are surface treated papers or organic films such as polyester. More than one (1) liner may be employed for easier handling, processing and storage. For example, a bottom liner may be a carrier liner on which the adhesive is placed or carried and a top liner may cover the top of the adhesive. Both the top and bottom liners may be peel off liners.

Adhesive films are typically not tacky at normal room temperature and are also provided on liners. Unlike pressure sensitive adhesive products, such adhesive films are typically employed in the mechanical assembly of parts by applying both heat and pressure.

Die-cuts consisting of more than one (1) laminate material are used to achieve specific application purposes. Many diverse materials are used in creating the laminate structure.

To mechanically bond two parts together, die-cuts of the above-mentioned adhesive products are cut to desired designs that typically mimic the contact surface geometry of the mechanical parts.

The current art of manufacturing die-cuts in high volume is to use mechanical dies to stamp or cut the target materials provided in sheets or rolls. Typically a stamping tool has a flat base containing the cutting edges arranged in the desired geometric design of the die-cut. The stamping tool travels in vertical motion to stamp, punch or cut the design on the target material. The technique of cutting the target materials with controlled cutting depth is called kiss-cutting. Typically, the target material with one (1) or two (2) liners is kiss-cut leaving the liner that is located at the furthest point from the cutting tool intact. For higher speeds of die-cutting, rotary dies may be used with rolls of materials to manufacture die-cuts.

In its simplest form, a roll of single coated adhesive tape with a protective liner is repeatedly kiss-cut using a cutting die mounted on a flat press machine. Upstream of the flat press machine, the roll of tape unwinds and the tape travels across the platform of the flat press machine. The cutting die moves in a perpendicular direction to the tape and punches through the single coated tape, but not the bottom liner to create kiss-cut die-cuts. Downstream, the kiss-cut tape is rewound into a roll. Afterward, any unwanted area of the die-cut tape is either removed manually by hand or by using a continuous roll of another tape to selectively remove the unwanted area. In a more sophisticated process, the removal of the unwanted area using a roll of another tape is incorporated into the die-cutting process in a single machine or a single process flow line.

In this known process of manufacturing die-cuts, the unwanted area of the die-cut, including the relatively expensive adhesive covering such area, is discarded as waste. It is not unusual that the unwanted areas of the die-cut comprise a majority of the overall area of the die-cut with the desired areas of the die-cut comprising only a small percentage of the area. Thus, much of the adhesive portions of the die-cut end up being cut out and discarded as waste. This increases the materials cost in manufacturing the die-cuts, leading to a more expensive purchase price for the die-cuts.

In addition, the current art of removing the unwanted area may slow down the die-cut manufacturing process when done manually by hand. For an automatic continuous removal process, the extra process steps of removing unwanted area without affecting the pattern and integrity of the wanted area adds process steps, complications and the cost of employing additional tapes and liners. The current roll to roll process method increases the complexity of the die-cutting process especially when there are multiple layers with different layers needing different geometric die-cut designs. Because the removed unwanted materials are discarded, the cost of the final die-cuts includes all material costs, both wanted and unwanted, as well as the costs of other tapes and liners used to remove the unwanted areas.

SUMMARY OF THE INVENTION

One aspect of this invention relates to a method of manufacturing a die-cut having a desired design corresponding to a contact geometry between two parts that are to be assembled or sealed together or to a geometry on a single part that is to be masked or shielded. The method comprises breaking down the desired design into a number of discrete, individual die-cut components that each correspond to only a portion of the complete design such that a plurality of individual die-cut components must be assembled together to form the complete design. The method further comprises providing supplies of the various die-cut components needed to assemble the design as well as providing a target liner on which the design will be assembled. Finally, the method comprises using automated, powered equipment to remove the die-cut components from the supplies thereof and to assemble the die-cut components on the target liner to form the complete design.

Another aspect of this invention relates to the die-cut made according to this method.

BRIEF DESCRIPTION OF THE DRAWINGS

This invention will be described more completely in the following Detailed Description, when taken in conjunction with the following drawings, in which like reference numerals refer to like elements throughout.

DETAILED DESCRIPTION

This invention comprises a process of manufacturing or assembling a desired die-cut 2 from individual die-cut components 4 and 6 and to the die-cut 2 so manufactured or assembled. Computer controlled pick and place equipment 8 may be used for high volume productions. The benefits are cost reduction via less waste of materials, simpler die-cut manufacturing process flow, and the ability to assemble more complex geometry, such as 3-dimensional structures, among others.

The term "die-cut" is a recognized term of art in the electronics industry to refer to a pattern or template that is used for various purposes, such as bonding two parts together, sealing two parts relative to one another, masking or shielding of a part or parts, etc. The term "die-cut" takes its name from the traditional method of manufacturing the pattern or template which involves stamping out the desired pattern or template using mechanical stamping or cutting dies and then removing unwanted portions of the material covering any open areas of the pattern or template.

This invention involves a new method of manufacturing die-cut 2 by placing or assembling individual components 4 and 6 of die-cut 2 in the desired pattern or template and without substantially covering open areas of the pattern or template with any material at all, thereby avoiding the large material waste of the prior art manufacturing method. The term "die-cut" will continue to be used to refer to the pattern or template that is formed even though the step of die-cutting might be wholly absent in this invention. The term "die-cut" as used in this application is defined simply as being the pattern or template and is not intended to require a die-cutting step or to be limited to an article that has been manufactured using a die-cutting step or any other type of cutting step.

Method A

A desired design for die-cut 2 is assembled from specific and dimensionally smaller die-cut components 4 and 6 utilizing computer controlled pick and place equipment 8 with a high degree of positional accuracy and speed.

Figure 2:
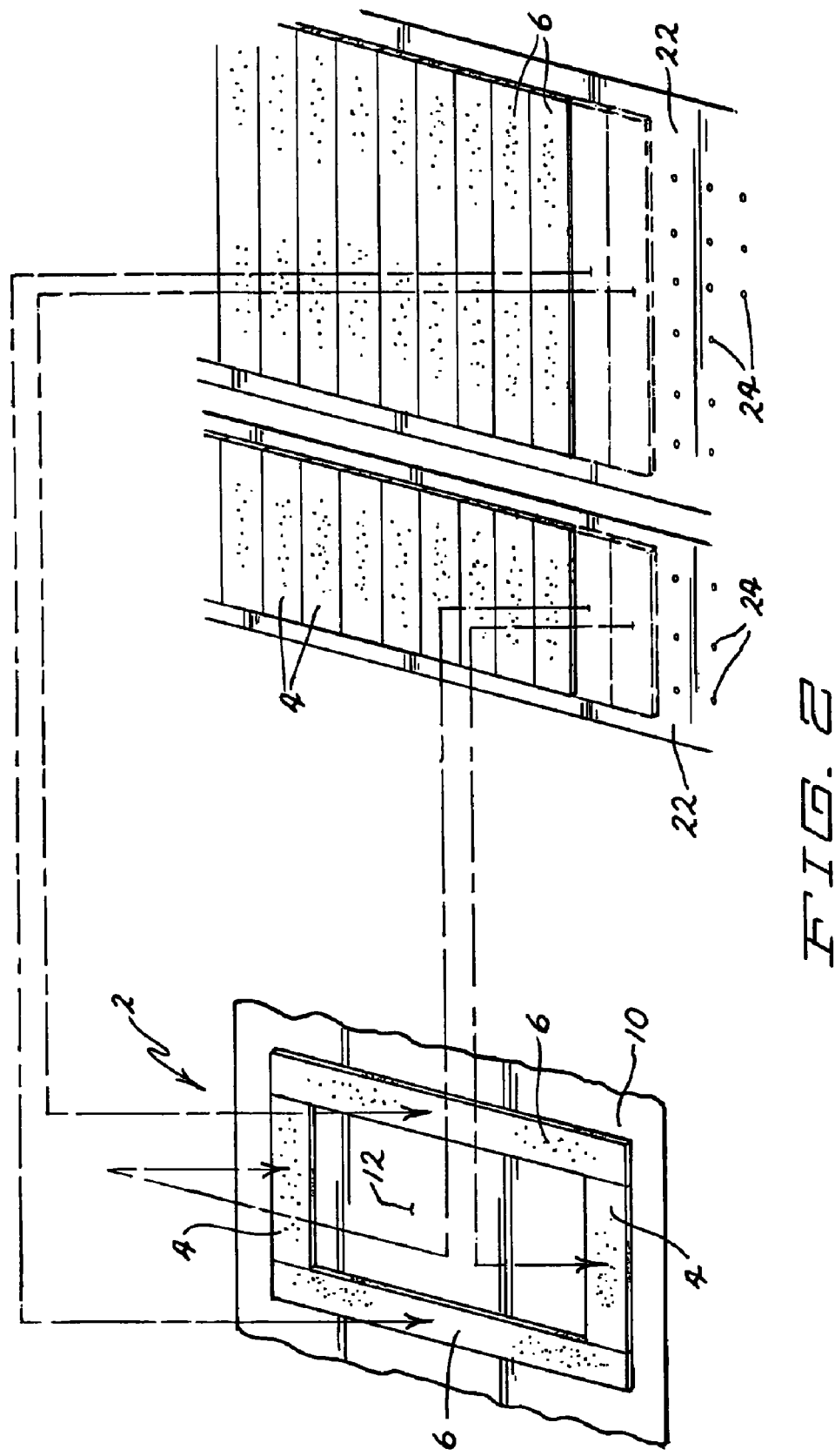
FIG. 2 is a diagrammatic view of the placement of the die-cut components onto the target liner in the method of FIG. 1 as well as being a perspective view of one die-cut manufactured according to the method of FIG. 1.

This invention will be described in the context of manufacturing a die-cut 2 having a simple, rectangular frame design. Die-cut 2 comprises the rectangular frame design made of a first material, such as an adhesive, placed atop a base or target liner 10 of a second material, such as a surface treated paper or film. As shown in FIG. 2, the rectangular frame design has a pair of parallel top and bottom components 4 joined by a pair of parallel left and right side components 6. The central area of the design, namely the interior area of the design between the top, bottom and side components 4 and 6, will be empty or blank forming a single large, open area 12. The rectangular frame design is meant to mimic the contact geometry of two mechanical parts that are to be assembled, joined or sealed together or the geometry on a single part that is to be masked or shielded. As noted above, the first material used in the components 4 and 6 is an adhesive but it need not necessarily be an adhesive.

A die-cut 2 having a simple rectangular frame design is used herein only for illustrative purposes. Often, the design of die-cut 2 will be far more complex. For example, the top, bottom and side components 4 and 6 might be curved in various ways, or the components 4 and 6 might vary in width along their length, or some of the components 4 and 6 might be missing so that the design is open ended along one or more sides, or there might be various other components in the design, such as cross ribs, that form multiple open areas in the design rather than a single, large central open area 12. But, even complex designs can still be broken down into simpler individual components.

As noted, the desired die-cut design is divided into dimensionally smaller die-cut components 4 and 6. Again, in the example of the rectangular frame design depicted in the drawings, there are two shorter rectangular top and bottom components 4 and two longer rectangular side components 6. The top and bottom components 4 in this example are identical to one another. The side components 6 in this example are also identical to one another.

Automated pick and place equipment 8 is used for picking individual die-cut components 4 and 6 from supplies thereof, for transferring such components to target liner 10 and for assembling the components on target liner 10. Such pick and place equipment is well known in the electronics industry and need not be described in detail herein. Examples of pick and place equipment 8 that may be used in this invention are the Model M6e sold by the I-Pulse Company, the Model YV100Xg sold by the Yamaha Motor Company, and the Model AX-301 sold by Philips Assembleon. Only a brief background description of such equipment is needed.

Figure 1:
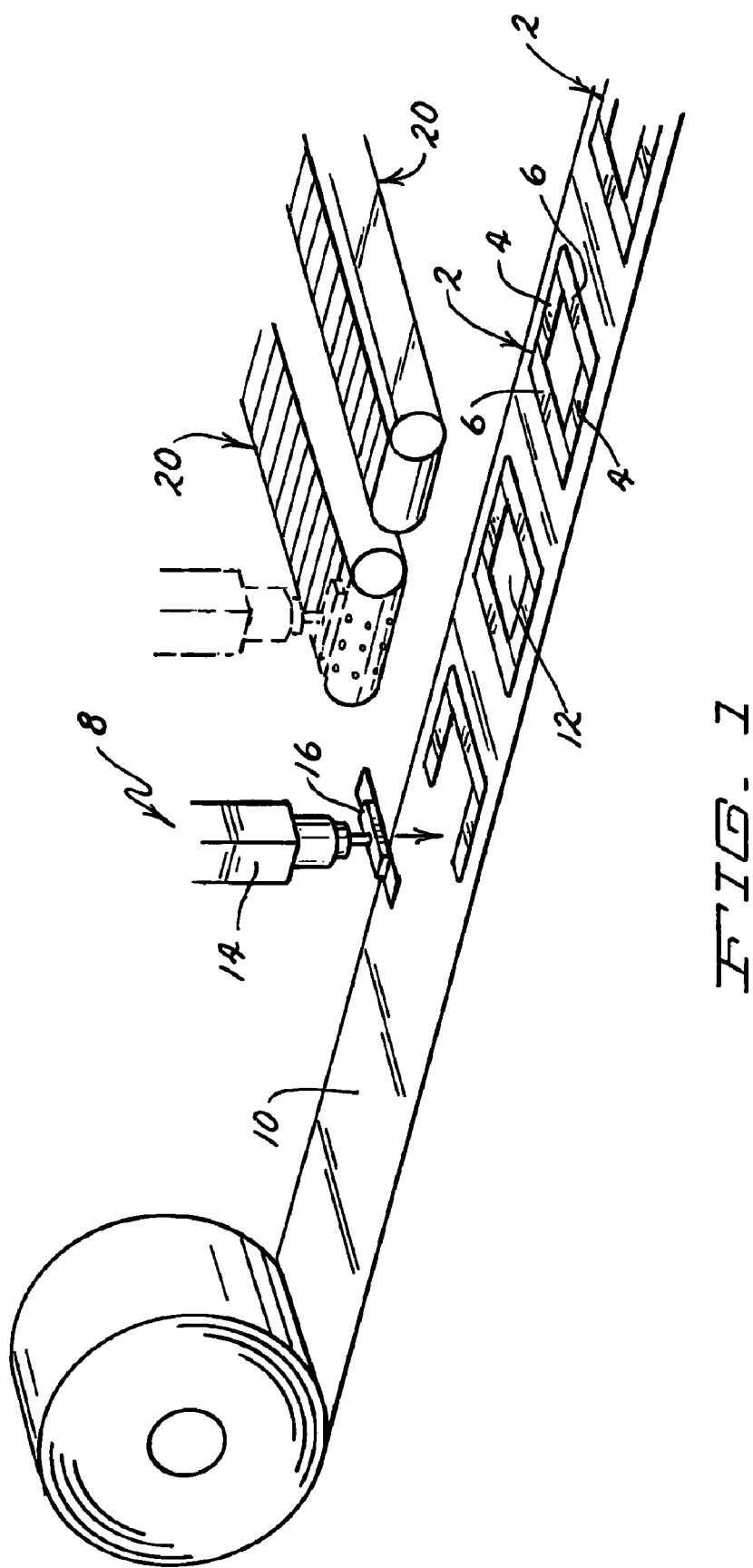
FIG. 1 is a diagrammatic view of a method of manufacturing or assembling a die-cut according to this invention, particularly illustrating an automated method in which a plurality of die-cuts are assembled onto a target liner by individually placing various individual components of the die-cut onto the target liner in a desired design using pick and place equipment.

Pick and place equipment 8 includes nozzles 16 for picking and placing die-cut 2 components and heads 14 for carrying and controlling nozzles 16. For simplicity, pick and place equipment 8 shown in FIG. 1 is illustrated with a single head 14 having a single nozzle 16. But, depending on the configuration of pick and place equipment 8, there may be multiple heads 14 and multiple nozzles 16 per head 14. In the case of the example being illustrated herein, two heads 14 with two nozzles 16 would probably be used. In this case, one head 14 would use its two nozzles 16 to pick up the top and bottom components 4 at one time or consecutively and the other head 14 would use its two nozzles 16 to pick up a pair of the side components 6 at one time or consecutively.

Each head 14 of pick and place equipment 8 moves in horizontal X and Y directions (and for certain pick and place equipment 8 in a Z direction as well) utilizing either linear motors or screw shafts driven by motors. Nozzles 16 built into head 14 can move up and down in a vertical Z direction and can also rotate about a vertical axis. Nozzles 16 are designed for picking and placing die-cut components 4 and 6. The operation of picking a die-cut component 4 or 6 is achieved by using negative air pressure or vacuum in nozzle 16. Nozzle 16 will have a series of openings of effective geometry connected to the air line to effectively pick die-cut components 4 and 6 and maintain the integrity of die-cut components 4 and 6 for effective placement while traveling to the placement location. Thus, the term "nozzle" as used herein is not limited to a nozzle having a single, circular port though it covers such a structure, but is intended to broadly cover any device having any number of ports or openings, circular or not, through which the vacuum is applied to pick or remove a die-cut component 4 or 6 out of the supply thereof.

If desired, the design of die-cut 2 may be repetitively pre-printed on target liner 10 using a colored ink that has high contrast to the color of the liner. The color contrast increases the efficiency of the vision systems in pick and place equipment 8 and for inspection with naked eyes. This pre-printed design aids in the placement of die-cut components 4 and 6 on target liner 10. Instead of pre-printing the design on the target liner, a series of fiduciary marks could be used on the target liner at selected discrete locations of the design, such as holes of certain geometry that are punched into or printed onto the target liner, to serve the same locational purpose for the assembly of die-cut 2.

Rolls or sheets of the various die-cut components are loaded onto or adjacent pick and place equipment 8 in various feeders 20. Various types of such powered, automated feeders 20 may be used with such feeders 20 being well known in the art.

FIGS. 1 and 2 show die-cut components 4 and 6 comprising an adhesive film placed on a carrier liner 22 in each feeder 20. Die-cut components are disposed in long rows or files of such components. In any event, the carrier liners 22 that carry the components are advanced towards pick and place equipment 8 to present the components to heads 14 and nozzles 16 of pick and place equipment 8. Nozzles 16 of heads 14 will pick the components off carrier liners 22 by adhering to the components on the carrier liners 22 using vacuum as described previously. As nozzles 16 grip die-cut components 4 or 6, feeders 20 assist in the removal of components 4 or 6 by peeling carrier liner 22 away from the components being gripped by nozzles 16. To help ease the picking or removal of die-cut components 4 and 6 from carrier liners 22, one or more carrier liners 22 can be perforated as indicated by the perforations 24 shown in FIG. 2.

For rolls of die-cut components that need to be picked up with nozzles 16 of pick and place equipment 8, dual liners comprising top and bottom liners may be needed for efficient pick and place operation. For pressure sensitive adhesive tapes, the use of dual liners may be necessary. The top liner and the pressure sensitive adhesive tape are kiss-cut to the bottom liner using a die. Nozzle 16 of pick and place equipment 8 then picks up a die-cut component 4 or 6, consisting of the top liner and the pressure sensitive adhesive tape, from the bottom carrier liner 22. Thus, traditional die-cutting manufacturing methods may be used to provide the individual die-cut components 4 and 6 used to subsequently assemble the design of die-cut 2.

Returning now to the example shown in FIG. 1, a target liner 10 of the desired die-cut is fed into pick and place equipment 8 at the upstream end of pick and place equipment 8. Target liner 10 travels inside and through pick and place equipment 8 and stops at the designated component placement locations. Nozzle(s) 16 of head(s) pick up die-cut components from their own respective carrier liners 22, move to the placement locations for die-cut components 4 and 6, and then place die-cut components 4 and 6 at the programmed spots. The vision alignment capability of pick and place equipment 8 may be used for aligning die-cut components 4 and 6 with the geometry of the design if the desired design of die-cut 2 has been pre-printed onto target liner 10 or other fiduciary marks are placed on target liner 10 as described earlier herein. After completing the placement of die-cut components 4 and 6, target liner 10 advances toward the downstream end of pick and place equipment 8 as shown in FIG. 1 and the process repeats.

Referring to FIG. 2, the assembly of a single die-cut 2 on target liner 10 is shown. In this view, the two components 4 that form the top and bottom components have to be picked from carrier liner 22 of one feeder 20 and two components 6 that form the side components have to be picked from carrier liner 22 of the other feeder 20. Nozzle(s) 16 on head(s) 18 of pick and place equipment 8 then carry these components to target liner 10 and place them onto target liner 10 in the specified design. In the example being used herein, the top component 4 is placed along a top side of the design, the bottom component 4 is placed along the bottom side of the design, and the side components 6 are placed along the left and right sides of the design to form the desired rectangular frame design. Die-cut components 4 and 6 can be picked and placed in the design in different orders or sequences as long as all die-cut components 4 and 6 are eventually properly placed. After all die-cut components 4 and 6 have been placed as shown in FIG. 2, a single die-cut 2 has been provided, i.e. a single pattern or template carried on a target liner 10. This will be repeated by pick and place equipment 8 at high speed to form many die-cuts 2.

Once the desired die-cut components 4 and 6 are assembled onto target liner 10 to form the desired die-cut, target liner 10 advances downstream in pick and place equipment 8 to enable the next die-cut 2 to be formed. As noted, this is done at high speed. For roll to roll operations, target liner 10 is then wound into a roll. For single panel operation, the individual panels are loaded into a stacking apparatus for handling. Eventually, die-cuts 2 are supplied to a customer for use for their intended purposes. Target liner 10 will ultimately be stripped away by the end user customer after die-cut 2 is properly positioned in its end use, e.g. product assembly.

In the example shown herein, die-cut components 4 and 6 comprise an adhesive film that is tacky on both sides. Such a film will adhere to target liner 10 when die-cut components 4 and 6 are placed onto target liner 10. Nozzles 16 of heads 14 may comprise low surface energy materials such as silicone rubber. In addition, additives such as fluoropolymer and others could be added to the silicone rubber to further decrease the surface energy. For certain die-cut components with a lower pressure sensitive adhesion level, the low surface energy material of nozzles 16 may eliminate the need for a top protective, peel off liner on die-cut 2 component itself, as is the case for the illustration shown herein.

In addition, there may be a need to increase the adhesion level between die-cut components 4 and 6 and target liner 10. This is useful for die-cut components that have either low adhesion or no adhesion at room temperature such as certain adhesive films. The purpose of increasing the adhesion of target liner 10 is to maintain the placement location of die-cut components 4 and 6 on target liner 10 during handling, further processing, storage and shipping. Very low tack singled coated tape could be used as the target liner for die-cut components with no adhesion at room temperature.

To increase the adhesion level between target liner 10 and die-cut components 4 and 6, heat may be applied to strategic locations of the desired design of die-cut 2. Infra-red [IR] heating apparatus with ability to heat localized areas or use of designed masks along with a single IR heat source to deliver controlled heat to specific locations may provide the necessary precision in both location and amount of heat delivered. This heating apparatus may be controlled with a closed-loop feedback temperature control scheme.

Because the desired design of die-cut 2 as described above is assembled from its individual die-cut components 4 and 6, there is no need to remove material from the open areas of the design since no material was placed there in the first place. Thus, the amount of waste in manufacturing die-cut 2 is greatly reduced along with the need for additional processing steps. This dramatically lowers the cost of manufacturing die-cut 2 compared to traditional manufacturing methods. In this invention, individual die-cut components 4 and 6 that make up the desired design are first provided as individual pieces and then such components are simply assembled onto a target liner. Almost any desired die-cut design may be broken down into simpler individual segments that will comprise a plurality of die-cut components.

Another advantage of this invention is that die-cut components 4 and 6 can be made from different materials if so desired. Some of the die-cut components 4 and 6 used in a particular design might be made of a pressure sensitive adhesive material and other die-cut components might be made of a different adhesive material or a non-adhesive material.

In addition, this invention can easily assemble both two dimensional die-cuts (as shown in FIGS. 1 and 2) or three-dimensional die-cuts. In a three dimensional die-cut, additional die-cut components are placed atop one or more layers of previously placed die-cut components. For complicated three dimensional multi-tier or multi-layer die-cuts, multiple pieces of pick and place equipment 8 combined with automatic programmable robotic liquid dispensers may be used to expand the production capability. The dispensers would deliver controlled amount of selected material to programmed locations.

Method B

The speed and accuracy in assembling die-cut components 4 and 6 in method A onto a target liner 10 depend on the capability of the computer controlled pick and place equipment 8. Higher pick and place speed may be achieved by lowering the positional accuracy. To speed up the process while still minimizing the waste, in Method B individual die-cut components 4 and 6 forming the desired die-cut design are die-cut slightly larger than their ultimate desired size. After their assembly onto target liner 10 using computer controlled pick and place equipment, the roll or panels of assembled die-cuts are then die-cut to the final desired geometry.

Thus, in Method A, die-cut components 4 and 6 are die-cut to substantially their desired size and placed precisely on target liner 10 using pick and place equipment 8. This entails no waste and little extra processing steps since there are no unwanted areas to remove. The tradeoff is that pick and place equipment 8 might need to operate at a slower speed to ensure placement accuracy.

Method B involves operating pick and place equipment 8 at a faster speed with the resultant decreased positional accuracy, of using die-cut components that are die-cut to be slightly larger than their ultimate desired size, and of then subsequently die-cutting the design so formed to remove the extra portions of die-cut components 4 and 6, namely those portions of die-cut components 4 and 6 that exceed the desired size. However, since die-cut components 4 and 6 were manufactured to be only slightly larger than their desired size, only small amounts of unwanted area must be removed. Thus, waste is still reduced from conventional methods of manufacturing die-cuts, but some extra processing steps are required.

In Method B, die-cut components 4 and 6 are preferably cut to be within the range of approximately 0.2 mm to 2.0 mm larger, and preferably approximately 1 mm larger, than their desired size along each side of the components. Method B is useful in die-cut designs in which individual die-cut components 4 and 6 are not abutted with one another and have no contiguous portions. Then, the extra material along the sides of each die-cut component can be trimmed away in the subsequent die-cutting operation. If a die-cut design includes die-cut components which are at least partially abutting, as in the rectangular frame example shown in FIGS. 1 and 2, Method B is not useful compared to Method A when the abutting portions must be precisely positioned next to one another and cannot be overlaid on top of one another. For certain materials, it would be permissible to overlay die-cut components 4 and 6 even along the abutting portions, in which case Method B might still have some advantages over Method A provided that the overlying portions of the die-cut components would not be cut away or removed.

Whether Method A or Method B is most economical in a given case will depend upon the requirements and economics of manufacturing a desired die-cut.

Various modifications of this invention will be apparent to those skilled in the art. For example, while use of pick and place equipment 8 is preferred for picking die-cut components 4 and 6 off carrier liners 22, automated, powered rollers (not shown) could be used instead. Such rollers with Z-axis position control rotate through controlled arcs of rotation and would be able to rotate over and laminate a component 4 or 6 from carrier liner 22 onto the target liner.

In addition, target liner 10 could also be perforated with perforations similar to perforations 24 on carrier liners 22. The perforations on target liner 12 would underlie the location of components 4 and 6 in each die-cut 2 to enable target liner 10 to be more easily separated when die-cut 2 is ultimately used by the end user for its intended purpose, e.g. assembly, sealing, masking, shielding, etc. Thus, the scope of this invention is to be limited only by the appended claims.

The invention claimed is:

1. A method of manufacturing a die-cut having a desired design corresponding to a contact geometry between two parts that are to be assembled or sealed together or to a geometry on a single part that is to be masked or shielded, which comprises:
   a) breaking down the design into a number of discrete, individual die-cut components that each correspond to only a portion of the complete design such that a plurality of individual die-cut components are assembled together to form the complete design;
   b) providing supplies of the various die-cut components needed to assemble the design;
   c) providing a flexible target liner on which the various die-cut components needed to assemble the design will be assembled such that the die-cut collectively formed by the various die-cut components will be supported by and carried on the target liner prior to an end use of the die-cut to assemble or seal the two parts together or to mask or shield the single part, the die-cut collectively formed by the various die-cut components being subsequently strippable from the target liner when the design of the die-cut is thereafter employed in the end use comprising the assembly or sealing together of the two parts or in the masking or shielding of the single part;

d) using automated and powered equipment to remove the die-cut components from the supplies thereof and to assemble the die-cut components on the target liner to form the complete design of the die-cut; and e) repeating step d to assemble a plurality of die-cuts on the target liner.

2. The method of claim 1, wherein step (a) comprises designing the individual die-cut components to be substantially identical in size to the size of the corresponding portions of the complete design.

3. The method of claim 2, wherein at least some portions of the individual die-cut portions substantially abut with one another in forming the complete design.

4. The method of claim 1, wherein the individual die-cut components are made from pressure sensitive adhesive material.

5. The method of claim 1, wherein step (d) comprises using automated and powered pick and place equipment.

6. The method of claim 5, wherein the step of using the pick and place equipment comprises:
   i) removing the components from the supplies thereof using at least one vacuum nozzle provided on at least one head of the pick and place equipment;
   ii) moving the head(s) until the nozzle(s) carrying the die-cut components are aligned with the various areas of the target liner onto which the components are to be placed; and
   iii) placing the die-cut components onto the target liner after such alignment by releasing the vacuum to the nozzle(s) to release the die-cut components from the nozzle(s); and
   iv) repeating steps i-iii as necessary to pick and place all of the die-cut components that form the complete design.

7. The method of claim 1, wherein step (b) comprises supplying the die-cut components to the pick and place equipment on automated, powered feeders.

8. The method of claim 7, wherein the feeders include traveling carrier liners on which a supply of die-cut components are placed, and further including moving the traveling carrier liners to advance the supply of the die-cut components to the pick and place equipment as the pick and place equipment removes the die-cut components from the carrier liners.

9. The method of claim 8, wherein the carrier liners of at least some of the die-cut component feeders are perforated at locations underlying the die-cut components to ease the task of removing the die-cut components from the carrier liners.

10. The method of claim 1, further including repeating step (d) sequentially to form multiple die-cuts on the target liner.

11. The method of claim 1, wherein step (a) comprises designing individual the die-cut components to be slightly larger in size than the size of the corresponding portions of the complete design, and further including the step of subsequently removing those portions of the die-cut components that exceed the size of the corresponding portions of the complete design after the complete design is assembled.

12. The method of claim 11, wherein the subsequently removing step comprises die-cutting through the complete design down to the target liner to remove the excess portions of the die-cut components.

13. The method of claim 11, wherein the individual die-cut components are sized to be approximately 0.2 mm to 2.0 mm larger in size than the size of the corresponding portions of the complete design along at least some of the sides of the die-cut components.

14. The method of claim 12, wherein the individual die-cut components are sized to be approximately 1 mm larger in size than the size of the corresponding portions of the complete design along at least some of the sides of the die-cut components.

15. The method of claim 13, wherein the individual die-cut components are sized to be approximately 1 mm larger in size than the size of the corresponding portions of the complete design along each side of the die-cut components.

16. The method of claim 11, wherein the individual die-cut components have no substantially abutting portions when the die-cut components form the complete design.

17. A die-cut made according to the method of claim 1.

* * * * *